(12) United States Patent
Hipwood et al.

(10) Patent No.: US 11,764,325 B2
(45) Date of Patent: Sep. 19, 2023

(54) DUAL BAND PHOTODIODE ELEMENT AND METHOD OF MAKING THE SAME

(71) Applicant: Leonardo UK Ltd, London (GB)

(72) Inventors: Les Hipwood, Essex (GB); Sudesh Bains, Essex (GB)

(73) Assignee: LEONARDO UK LTD, London (GB)

( * ) Notice: Subject to any disclaimer, the term of this patent is extended or adjusted under 35 U.S.C. 154(b) by 0 days.

(21) Appl. No.: 17/935,600

(22) Filed: Sep. 27, 2022

(65) Prior Publication Data
US 2023/0018071 A1   Jan. 19, 2023

Related U.S. Application Data

(62) Division of application No. 16/960,416, filed as application No. PCT/EP2019/050158 on Jan. 4, 2019, now Pat. No. 11,482,638.

(30) Foreign Application Priority Data

Jan. 8, 2018 (GB) ..................................... 1800275

(51) Int. Cl.
| | |
|---|---|
| *H01L 31/18* | (2006.01) |
| *H01L 27/144* | (2006.01) |
| *H01L 31/0296* | (2006.01) |
| *H01L 31/101* | (2006.01) |
| *H01L 31/103* | (2006.01) |
| *H01L 31/11* | (2006.01) |

(52) U.S. Cl.
CPC ...... *H01L 31/1832* (2013.01); *H01L 27/1443* (2013.01); *H01L 31/02966* (2013.01); *H01L 31/1013* (2013.01); *H01L 31/1032* (2013.01); *H01L 31/11* (2013.01)

(58) Field of Classification Search
CPC .......... H01L 31/1832; H01L 31/02966; H01L 31/1013; H01L 31/1032; H01L 31/11
USPC .......................................................... 257/442
See application file for complete search history.

(56) References Cited

U.S. PATENT DOCUMENTS

| | | | |
|---|---|---|---|
| 4,318,115 A | 3/1982 | Yoshikawa et al. | |
| 4,323,911 A * | 4/1982 | Campbell | ............... H01L 31/11 257/E27.12 |

(Continued)

FOREIGN PATENT DOCUMENTS

WO    2011067058 A1    6/2011

OTHER PUBLICATIONS

Office Action (Notice of Deficiencies) dated Sep. 19, 2022, by the Israeli Patent Office in corresponding Israeli Patent Application No. P-596989-IL. (4 pages).

(Continued)

*Primary Examiner* — Calvin Y Choi
(74) *Attorney, Agent, or Firm* — BUCHANAN INGERSOLL & ROONEY PC

(57) ABSTRACT

Mercury cadmium telluride (MCT) dual band photodiode elements are described that include an n-type barrier region interposed between first and second p-type regions. The first p-type region is arranged to absorb different IR wavelengths to the second p-type region in order that the photodiode element can sense two IR bands. A portion of the second p-type region is type converted using ion-beam milling to produce a n-type region that interfaces with the second p-type region and the n-type barrier region.

11 Claims, 4 Drawing Sheets

(56) References Cited

U.S. PATENT DOCUMENTS

| | | | | |
|---|---|---|---|---|
| 5,448,099 A * | 9/1995 | Yano | ................... | H01L 27/1443 |
| | | | | 257/E27.128 |
| 10,002,979 B1 * | 6/2018 | Yao | ....................... | H01L 31/105 |
| 2012/0068225 A1 | 3/2012 | Gravrand et al. | | |
| 2012/0068295 A1 * | 3/2012 | Gravrand | .......... | H01L 27/14652 |
| | | | | 438/73 |
| 2020/0335655 A1 | 10/2020 | Hipwood et al. | | |

OTHER PUBLICATIONS

Supplemental Notice of Allowability dated Sep. 28, 2022, by the U.S. Patent and Trademark Office in U.S. Appl. No. 16/960,416.

Becker, "Multicolor LWIR Focal Plane Array Technology For Space and Ground Based applications", Proc. of SPIE, vol. 5564, Oct. 22, 2004, pp. 1-14.

International Search Report (PCT/ISA/210) dated Mar. 19, 2019, by the European Patent Office as the International Searching Authority for International Application No. PCT/EP2019/050158.

Office Action (Communication) dated May 24, 2022, by the European Patent Office in corresponding European Patent Application No. 19 700 064.9. (5 pages).

Office Action dated Jul. 20, 2021, by the Canadian Patent Office in corresponding Canadian Patent Application No. 3,086,275. (4 pages).

Office Action dated Jul. 29, 2022, by the Canadian Patent Office in corresponding Canadian Patent Application No. 3,086,275. (4 pages).

\* cited by examiner

DUAL BAND PHOTODIODE ELEMENT AND METHOD OF MAKING THE SAME

This application is a divisional of U.S. application Ser. No. 16/960,416 filed on Jul. 7, 2020, which claims priority to UK Patent Application 1800275.8 filed in the United Kingdom on Jan. 8, 2018. The entire content of each prior application is hereby incorporated by reference.

The invention relates to a photodiode element responsive to dual band electromagnetic radiation, e.g. infrared radiation, a method of making said photodiode element and detector arrays comprising multiple of said photodiode elements.

Dual waveband infrared focal plane arrays offer several advantages over their single waveband counterparts, including enhanced contrast for signal processing and scene interpretation, and the ability to provide absolute object temperature measurement.

Mercury cadmium telluride (MCT) is a common material used for fabricating dual waveband infrared detectors. The cadmium mole fraction in a particular layer, termed x, determines the cut-off wavelength of that layer, with higher x corresponding to shorter wavelengths. For example, x is typically 0.22 and 0.27 for longwave infrared (LWIR) and medium wave infrared (MWIR) absorbers with 10 and 6 μm cut-off wavelengths respectively. The principle can be applied to any materials system where the band gap can be engineered to provide the desired cut-offs.

FIG. 1 illustrates a portion of a mesa array 1 of dual-band infrared photodiode elements 2, each comprising back to back p-n photodiode junctions 3,4. Each element 2 includes a first n-type absorber layer 6 arranged to absorb medium wave infrared (MWIR) and a second n-type absorber layer 7 arranged to absorb longwave infrared (LWIR). The two p-n photodiode junctions 3,4 are separated by a wide band gap p-type barrier layer 8. The aforementioned layers 6, 7, 8 are grown monolithically from MCT onto a transparent common layer 9 also of MCT by a technique such as MBE or MOCVD.

An indium bump 10 is provided on the face of each mesa for electrical connection to a readout integrated circuit 11. Infrared light enters the array from the substrate 9 side, the shorter wavelength MWIR being absorbed by the first n-type layer 6 and the longer wavelength LWIR being absorbed by the second n-type layer 7. The first n-type layer 6 acts as a filter preventing MWIR light reaching the second n-type layer 7.

When a voltage is applied across the device one of the PN junctions 3,4 will be in reverse bias and the other in forward bias; photocurrent from the n-type absorber layer 6,7 that is directly adjacent to the reversed biased PN junction 3,4 will appear in the external circuit. Thus a signal corresponding to LWIR absorption will be obtained with one bias polarity and a signal corresponding to MWIR absorption with the opposite bias polarity. During operation, the bias across the back-to-back photodiode junctions 3,4 can be sequentially switched to provide LWIR and MWIR signals that are spatially but not temporally coherent.

FIG. 2A illustrates a known design of mesa detector element 20 that provides temporal coherence. The element 20 comprises an n-type barrier layer 21 interposed between a shorter wave (SW) n-type absorber layer 22 and a longer wave (LW) n-type absorber layer 23. A p-type window layer 24, transparent to both SW and LW is arranged adjacent the SW absorber layer 22 to form a first PN-junction 25, and a p-type cap layer 26 is provided over the LW absorber layer 23 to form a second PN-junction 27; the first and second PN junctions 25,27 are arranged back-to-back.

The top of the mesa element 20 is provided with two electrical bump contacts 28,29 for connection by bump bonding to a readout circuit (not shown) to enable both photodiodes to be simultaneously reverse-biased. A first of the electrical contacts 28 is arranged for ohmic contact with the p-type cap 26, while a second electrical contact 29 connects to an overlay contact 31 which shorts the p-cap layer 26 such that the second contact has a direct ohmic connection to the n-type LW absorber 23. To achieve this an etched slot 30 is provided through the p-type cap 26, between the two contacts 28, 29. The slot 30 acts to electrically isolate the first and second contacts 28,29. Ensuring the first and second contacts 28,29 are electrically isolated from each other and avoiding shorting of the photodiode layers, requires careful control of the etching, passivation and metallisation procedures.

The first and second PN-junctions 25,27 are simultaneously reversed biased by applying a voltage across the element 20 such that the second contact 29 is positive and the first contact 28 and the common contact 32 are negative. SW light absorbed by the n-type SW layer 22 generates a photocurrent between the second contact 29 and common contact 32 with electron flow through the n-type barrier 21 and LW absorber 23 to the second contact 29 via the overlay contact 31. LW light absorbed at the n-type LW absorber 23 generates a photocurrent between the second contact 29 and first contact 28 with corresponding electron flow through the n-type LW absorber 23 to the second contact 29. As such, the signal at the second contact 29 is representative of the combined absorption of LW and SW, whilst the signal at the first contact 28 is representative of the absorption of LW. The strength of the SW absorption can be determined by subtracting the LW signal from the combined signal.

FIG. 2B is variant design of element 30 operating in a similar manner to that of FIG. 2A but having a NPN rather than PNP configuration. The first contact 31 is in direct electrical contact with the top n-type LW absorber layer 32. An edge of the mesa element 30 is etched down to the intermediate p-type barrier layer 33 and an overlay 34 provided to place the p-type barrier layer 33 in ohmic connection with the second contact 35. An insulating layer 36 isolates the second contact 35 from the top n-type LW absorber 32. In operation the polarities of the first contact 31, second contact 35 and common (not shown) are reversed compared with that of the previous example in order to simultaneously reverse bias the back-to-back diodes.

The need to provide a contact to an intermediate layer complicates the manufacture of the elements 20, 30 of FIGS. 2A and 2B. Further, the removal of material from the top of the mesa element 30 of FIG. 2B, results in a blind spot to LW. Additionally, the removal of material increases the minimum pitch of the element achievable.

FIG. 3 illustrates a further known design of detector element 40. The element 40 comprises a p-type barrier layer 41 that is interposed between a p-type SW absorber 42 and p-type LW absorber 43. The laminate is formed on a substrate layer 44 of CdZnTe on which is provided an n-type window common layer 45. The n-type window common layer 45 with p-type SW absorber 42 provide the SW photodiode 46. The LW photodiode 47 is formed by doping (ion implantation) the p-type LW absorber 43 to provide an n-type surface region 48 within the p-type layer 43. A first contact 49 is located on the n-type region 48 and a second contact 50 is located directly on the p-type LW absorber 43. A voltage is placed across the element 40 such that the common contact (not shown) and first contact 49 have a positive polarity and the second contact 50 has a negative polarity. The signal at the second contact 50 is proportional to combined SW and LW adsorption and the signal at the first contact 49 to LW absorption.

This design avoids the blind spot problem of the arrangements of FIG. 2B. The implanted n-type region needs to be larger than the electrical contact to provide tolerance in the positioning of the first contact 49. This limits the minimum pitch achievable for an array of elements 40. Additionally, the use of ion implantation requires the additional subsequent step of a high temperature activation anneal necessitating a separate photolithography stage for adding the contact.

The present invention was conceived to ameliorate the problems of the prior art.

According to a first aspect of the invention there is provided a photodiode element responsive to dual band radiation; the photodiode element comprising: a first p-type region; a second p-type region; a first n-type region arranged between the first p-type region and the second p-type region to provide PN-junctions; one or more of the first p-type region, second p-type region and first n-type region providing a first absorbing region for absorbing a shorter wave band and a second absorbing region for absorbing a longer waveband; the first absorbing region and the second absorbing region being arranged on opposing sides of an n-type barrier provided by the n-type region, the n-type barrier being substantially non-absorbent to the longer wave band; the photodiode further comprising a second n-type region that interfaces such as to be in electrical and physical contact with the first n-type region; and two ohmic electrical contacts, a first arranged on and contacting the second p-type region and a second on and contacting the second n-type region.

Through this arrangement electron flow between the second contact and the first n-type region can occur via the second n-type region, precluding the need for an etched slot. The arrangement can also be manufactured using process steps that are only a small variation from the more straightforward method used to manufacture the sequential mode design of FIG. 1 making it more straightforward to produce than the design of FIG. 3.

Through the afore described arrangement, there will exist an interface between the second p-type region and the second n-type region providing a portion of the PN-junction associated with absorption of the longer waveband. A plane in which a portion of the PN-junction provided between the second p-type region and the second n-type region is non-parallel to and intersects another portion of the PN-j unction provided between the second p-type region and first n-type region. The portion of the PN-junction provided in part by the second n-type region may extend to a surface of the photodiode element on which the first and second contacts lie.

The second n-type region may be a portion of the second p-type region that has been type converted. Type conversion may be by, for example, ion milling. As such the second n-type region may comprise a recess formed by ion-milling. Advantageously the higher x of the middle n-layer barrier self-limits the type conversion to the second p-type region, i.e. such that the first p-type region will not be converted.

Because the ion-milling type conversion process can be carried out at room temperature, a single photolithography stage can be used to both define the type converted second n-type region and metalize to provide the second contact on the second n-type region. As the ion milling process means the second n-region is self-aligned to the second contact the second n-region can advantageously be of smaller area compared to n-type region type formed through type conversation by implantation, where some allowance has to be given for process tolerances in aligning the contact. This allows potentially smaller element pitches to be achieved.

Where the photodiode element is of mesa form, a further advantage of using an ion-milling process is that the conversion process can be carried out using the same ion beam etcher as used to delineate the mesa slots.

The first p-type region may provide, at least in part, the first absorbing region, and the second p-type region may provide, at least in part, the second absorbing region.

In one arrangement the first p-type region may wholly provide the first absorbing region and the second p-type region plus second n-region may wholly provide the second absorbing region.

In such an example the second n-type region and the second p-type region may interface, i.e. be in direct physical and electrical contact with the n-type barrier.

Alternatively the first absorbing region and/or the second absorbing region may be provided, at least in part by the first n-type region. As such the n-type region may also comprise an n-type absorption region for absorbing the shorter band and/or an n-type region for absorbing the longer band. The n-type region for absorbing the shorter band may be provided between the n-type barrier and the first p-type layer. The n-type region for absorbing the longer band may be provided between the n-type barrier and the second p-type layer.

In one arrangement the n-type region may define one or both of the first and second absorbing regions alone. Where the n-type region provides the second absorbing region alone, the second p-type region and second n-type region may act as a cap.

In another arrangement, the first absorbing region may be provided by a combination of the first p-type region and the first n-type region and the second absorbing region provided by a combination of the second p-type region and the first n-type region.

The first n-type region barrier layer may be substantially non-absorbent to the shorter wavelength radiation The photodiode element may in addition comprise a further p-type layer that is relatively highly conductivity compared with first and second p-type regions. The further p-type layer may interface the first p-type region. The further p-type later may be common to multiple photodiode elements. The further p-type layer may be substantially non-absorbent to either the longer or shorter wave band.

The first and second ohimic electrical contacts may be provided by metallic material.

The photodiode element may be connected to a third ohimic electrical contact (e.g. provided by metallic material). The third ohimic electrical contact may be arranged on the other side of the n-type barrier to the first and second contacts. The third ohimic electrical contact may be in direct contact with the further p-type layer.

The photodiode element may be comprised from MCT. The photodiode element may have a mesa structure.

The first and second contacts may provide contact between the element and a read out integrated circuit (ROIC). The first and second contacts may be bump contacts (e.g. comprise indium) for bump bonding the element to the ROIC. The second contact may be formed over the recess within the second n-type region.

The shorter wave band and longer wave band are typically discrete, i.e. not immediately adjacent one another. The photodiode element may be operative to any two bands of infrared radiation between SWIR and VLWIR. In one arrangement a first band may lie partially or wholly in MWIR and a second band may lie partially or wholly in LWIR.

In another aspect of the invention there is provided a detector array comprising photodiodes elements as variously described above. The detector array may comprise a focal plane array comprising the photodiode elements that is bonded to a ROIC.

According to a second aspect of the invention there is provided a method of manufacturing a photodiode element, the method comprising:
form a first p-type layer;
form a first n-type region that includes a n-type barrier layer on the first p-type layer;
form a second p-type layer on the first n-type region; and
type convert a portion of the second p-type layer to provide a second n-type region that is in electrical and physical contact with both the second p-type layer and the first n-type region;
provide a first electrical contact on the second p-type layer and a second electrical contact on the second n-type region.

The portion of the second p-type region may be type converted by ion beam milling to provide the second n-type region. The second p-type region may be comprised from a MCT semiconductor.

The method may comprise forming a passivation layer over the element and a window in the passivation layer through which the second p-type layer is exposed. The method may further comprise ion-milling through the window to convert the exposed portion of the second p-type layer to the second n-type region.

The method may include depositing a metal through the window to form a contact.

The method may include forming a mask over the element that leaves the window exposed, ion beam milling through the mask to convert the exposed portion of the second p-type layer to the second n-type region, and depositing a metal through the mask to form a contact with the n-type region.

Before forming a passivation layer, the method may include providing a second mask over the element, forming the passivation layer over the element, and removing the second mask to provide the window in the passivation layer to expose a portion of the second p-type layer.

The method may include etching through the second p-type layer, first n-type region and first p-type layer to form a mesa photodiode element.

The method may further including growing a p-type common layer on a substrate and growing the first p-type layer on the p-type common layer.

The invention will now be described by way of example with reference to the following figures in which.

Figure 1:
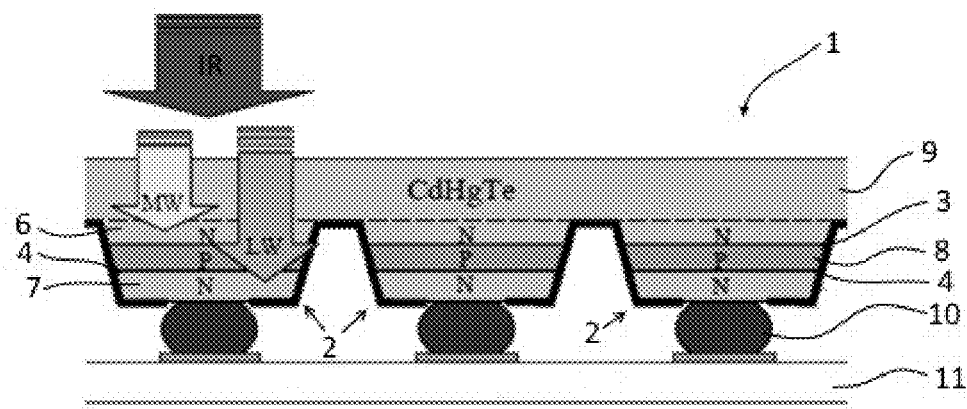
FIG. 1 is a schematic side view of part of an array of photodiode elements of the prior art.
Figure 2A:
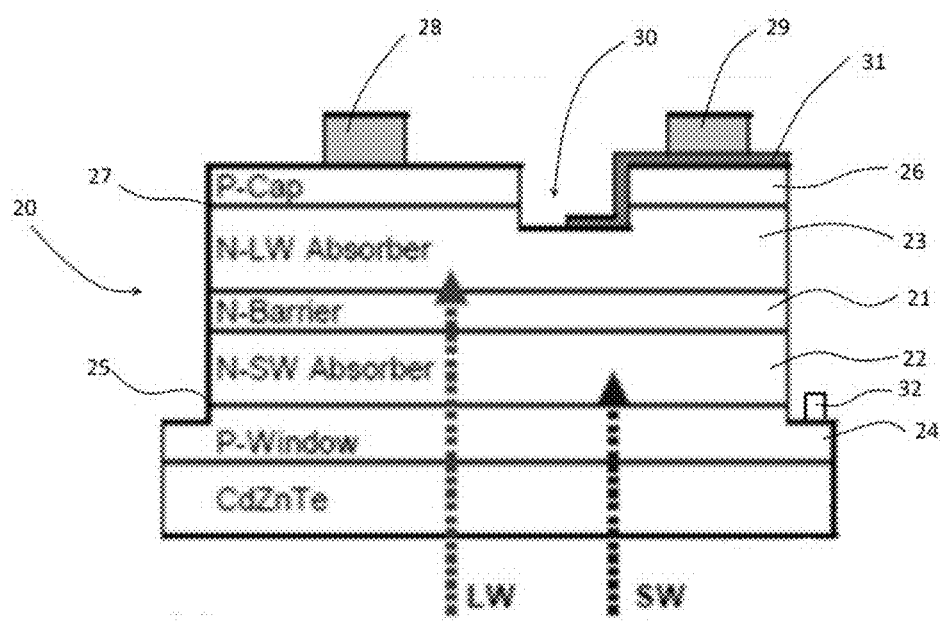
FIG. 2A is a schematic side view of second example of a prior art photodiode element that provides spatially and temporally coherent dual band signals.
Figure 2B:
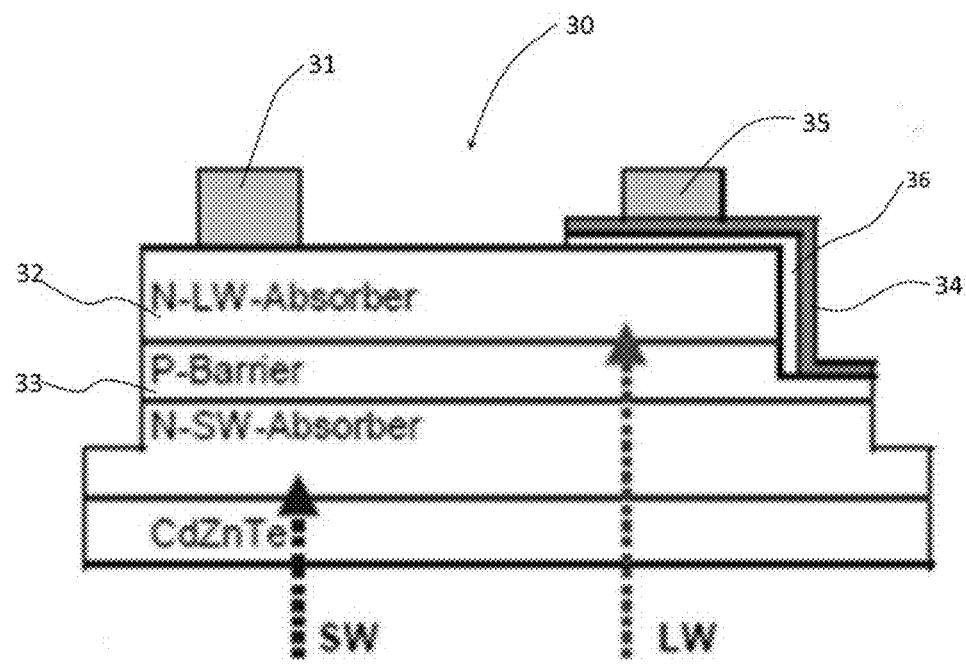
FIG. 2B is a schematic side view of third example of prior art photodiode element that provides spatially and temporally coherent dual band signals.
Figure 3:
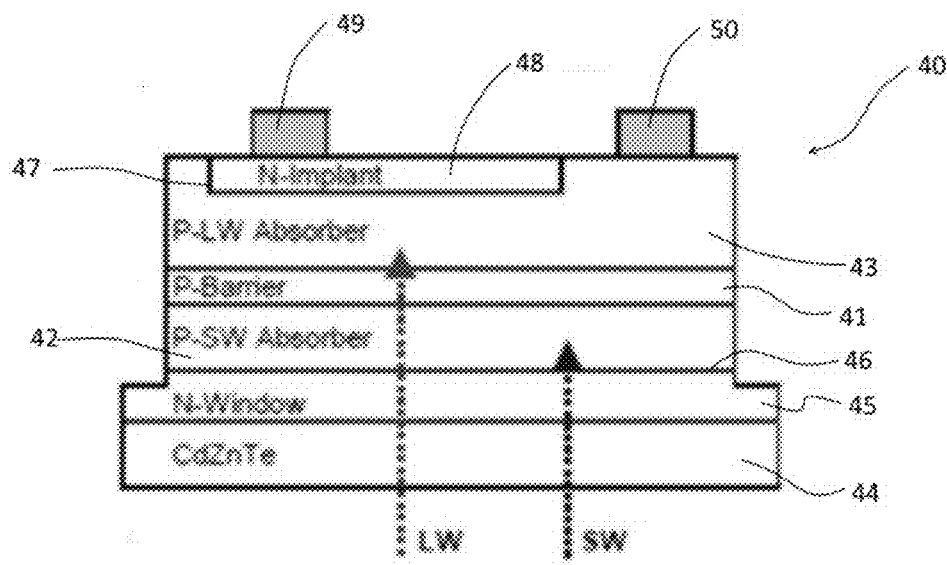
FIG. 3 is a schematic side view of further example of prior art photodiode element that provides spatially and temporally coherent dual band signals.
Figure 4:
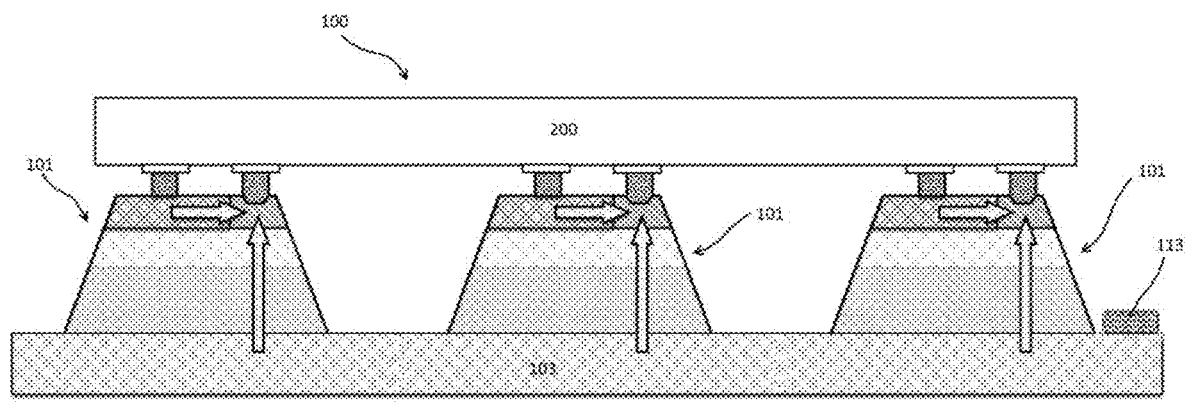
FIG. 4 is a schematic of a portion of an infrared focal plane array of photodiode elements for providing spatially and temporally coherent dual band signals.

FIG. 4 illustrates mesa photodiode elements 101 of a focal plane array 100 for providing spatial and temporal coherent dual band signals for receipt by a readout integrated circuit (ROIC) 200. Note that FIGS. 4-7 do not necessarily show the layers and regions to scale. The arrows represent the direction of electron flow of the photocurrents when the photodiodes are reversed biased.

Figure 5:
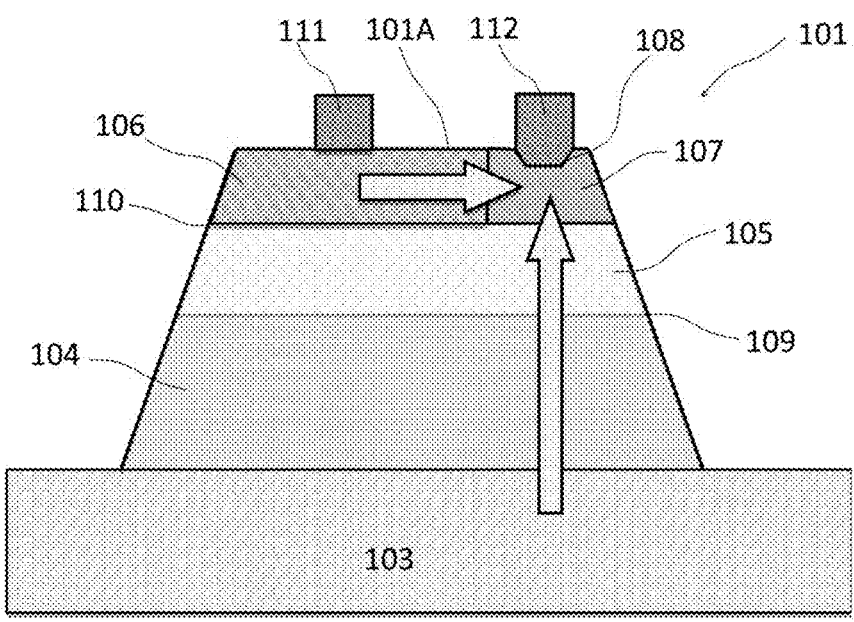
FIG. 5 is a schematic side view of one of the photodiode elements of FIG. 4.

With reference to FIGS. 4 and 5, the element 101 comprises a relatively high conductivity p-type layer 103 that is common to the elements 101 of the array 100. Provided on the high conductivity p-type layer 103 is a first p-type layer 104 for absorbing a wave band of a shorter wavelengths (shorter wave band) of IR (e.g. lying within MWIR), a n-type barrier layer 105 formed on the first p-type layer 104, and a second p-type layer 106 for absorbing a wave band of longer wavelengths (longer wave band) of IR (e.g. lying within LWIR) formed on the n-type barrier layer 105 such that the n-type barrier layer 105 is interposed between the first and second p-type layers 104,106. The n-type barrier layer 105 is substantially transparent to both the shorter wave band and the longer waveband of IR.

The element 101 further includes an n-type region 107 that extends from a top 101A of the mesa element 101 to interface with the n-type barrier 105 such that they are in physical and electrical contact. The n-type region 107 is provided by type-converting a portion of the second p-type layer 106 using ion beam milling. This technique is described in WO2011/067058 Jones & Bains published 9 Jun. 2011 hereby incorporated by reference in its entirety. The n-type region 107, like the second p-type region 106 absorbs the longer wave band IR. As result of the ion beam milling process 107 the n-type region has a recess 108 that extends from the top of the mesa 101A towards the n-type barrier 105.

The element 101 described comprises two PN-junctions, a first 109 extends parallel to the top 101A of the mesa element 101, formed between the first p-type layer 104 and the n-type barrier 105, and a second 110 provided in part between the second p-type layer 106 and the n-type barrier 105 and in part between the second p-type layer 106 and the n-type region 107. A first portion of the second PN junction 110 provided between the second p-type layer 106 and n-type barrier 105 lies substantially parallel to the mesa top 101A, whereas a second portion of the second PN-junction 110 between the second p-type layer 106 and the n-type region 107 extends laterally away from a plane in which the first portion of the PN junction 110 lies, to the top surface 101A of the mesa element 101.

The element 101 further includes a first metallic electrical contact 111 and a second metallic electrical contact 112. The first and second contacts 111, 112 are provided by respective first and second indium bumps on the top 101A of the mesa element 101. The first contact 111 is provided on and in ohmic contact with the second p-type layer 106. The second contact 112 is on and in ohmic contact with the n-type region 107. Each element 101 is connected to a third electrical contact 113 (see FIG. 4), via the common high conductive p-type layer 103. The third contact 113 is provided by an indium bump on the high conductive p-type layer 103.

Nevertheless, in principle, each element 101 may be provided with its own third contact.

The n-type region 107 provides electrical connection between the second contact 112 and the n-layer barrier 105 whilst electrically isolating the second contact 112 from the first contact 111 on second p-type layer 106.

In operation, both PN junctions 109,110 are reverse biased simultaneously by applying a voltage across the element 101 such that the first contact 111 and common 113 are negative and the second contact 112 is positive. Absorption of the shorter wave length light in the first p-type layer 104 proximate the first PN junction 109 results in electron flow (indicated by vertical arrow on FIGS. 4 & 5) through the n-type barrier 105 to the second contact 112 via the n-type region 107, i.e. a photocurrent between the second contact 112 and common 113.

Longer wavelength light absorbed by the second p-type layer and second n-type region proximate the second PN-junction 110 produces an electron flow (represented by horizontal arrow of FIGS. 4 & 5) through the second p-type layer 106 and n-type region 107 towards the second contact 112, i.e. a photocurrent between the second contact 112 and first contact 111. Note the n-type barrier 105 acts as a barrier to hole flow substantially preventing the flow of holes generated by absorption of the shorter waveband to the first contact 111 and similarly holes generated through absorption of the longer wave light in the second p-type layer 106 to the common 113.

Figure 6:
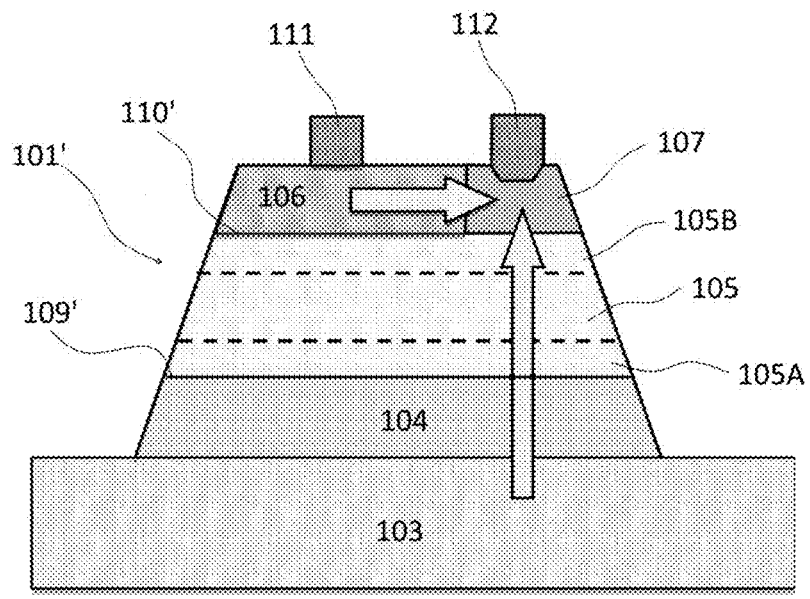
FIG. 6 is a schematic side view of a variant photodiode element for providing spatially and temporally coherent dual band signals.

FIG. 6 illustrates a variant design of element 101' in which like parts have are given the same numbers as FIG. 5. The element 101' further comprises a shorter wave n-type absorbing layer 105A on one side of the barrier 105 directly adjacent the first p-type absorber 104 so as to provide the first PN junction 109', and a longer wave n-type absorber layer 105B arranged on the other side of the barrier 105 directly adjacent the second p-type layer 106 to provide a portion of second PN junction 110'. The longer wave n-type absorber layer 105B lies in direct physical and electrical contact with the n-type region 107. In this arrangement electron-holes pair can be generated by absorption of MWIR in either of the first p-type layer 104 or shorter wave n-type absorber 105A to provide a MWIR signal. Similarly electron-holes pairs can be generated by absorption of LWIR in either the longer wave n-type absorber layer 105B, the second p-type layer 106 or n-type region 107 to provide the LWIR signal.

Figure 7:
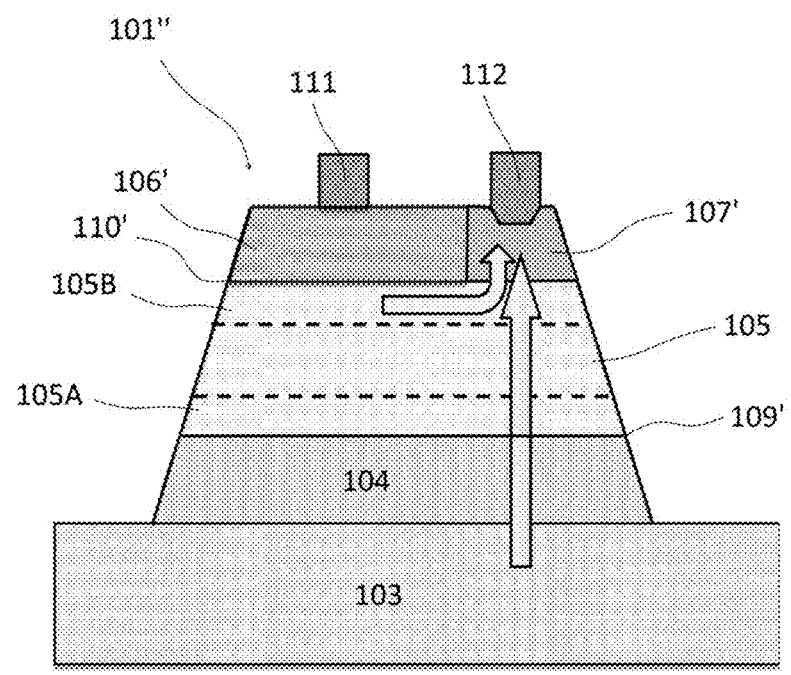
FIG. 7 is a schematic side view of a further variant photodiode element for providing spatially and temporally coherent dual band signals.

FIG. 7 illustrates a variant design of element 101" to that of FIG. 6 in which the second p-type layer 106' is a wide band gap cap provided by a high x material which is transparent to both shorter and longer wavebands. The p-type cap 106' is type converted using ion-milling to provide an n-type cap 107'.

The n-type cap 107' provides a conduit for electron flow between the n-type barrier 105 and second contact 112, and the longer wave n-type absorber 105B and the second contact 112.

The arrangement of FIG. 7 offers the potential for lower dark current because the higher bandgap of the p-type cap 106' compared with longer wave n-type absorber 105B provides that the PN—junction 110' is a heterojunction rather than a homojunction.

The above examples can all be grown as a monolith from MCT using epitaxy, MOCVD or the like using techniques known to those skilled in the art.

The following provides an example procedure for the manufacture of an array of photodiode elements of FIG. 4:

a) Epitaxially grow MCT wafer on a suitable substrate such as GaAs; the composition of the MCT is controlled during growth to provide a stacked layered comprising the first p-type layer 104, n-type barrier 105 and second p-type layer 106 so as to provide first and second PN junction 109, 110. Arsenic is included with the MCT during growth to form the p-type layers and iodine to form the n-type layer. In one variant p-type extrinsic impurities may be introduced during the growth of the MCT layers. The different band gaps of the layers 104, 105, 106 are achieved through using different cadmium mole fractions (x) as is known to those skilled in the art.

b) Define a mesa array pattern by photolithography and etch to form mesa slots using a combination of dry and wet etching so as to provide array of mesa elements 101.

c) Define and apply a resist pattern comprising first and second pads each on top surface 101A of the mesa elements 101 using photolithography.

d) Deposit a passivation layer (e.g. of CdTe or CZT) and lift off the resist pattern (first and second pads) to define first and second windows in the passivation layer on the top of each mesa through which the second p-type layer 106 is exposed.

e) Anneal the wafer to interdiffuse the passivation layer with the MCT material.

f) Define and deposit a second resist pattern that covers the mesa element except the first windows.

g) Using a suitable pre-treatment, deposit an ohmic p-contact barrier metal.

h) Lift-off the resist to leave the metallisation in the p-contact window.

i) Define and apply a third resist pattern that covers the mesa elements except the second windows.

j) Ion-beam mill through the second mask and second window to form the n-type region such that it extends down to the n-type barrier layer 105.

k) Deposit an ohmic n-contact barrier metal through the second mask to contact with the type converted n-type region.

l) Remove the third resist.

m) Define and apply a fourth resist pattern that covers the mesa except the p-contact barrier metal and n-type barrier metal.

n) Deposit an indium bump metallisation layer.

o) Lift-off the fourth resist to provide indium bump contacts.

p) Dice and bump-bond onto a suitable ROIC.

The structure of FIG. 6 is produced through variation of the cadmium mole fractions (x) during formation of the sandwiched n-type layer to provide layer 105A and 105B. The p-type cap layer is formed by using a relatively large cadmium mole fraction (x).

The common contact windows can be provided by a number of un-passivated mesas, normally but not exclusively located near the edge of the array. A portion of the p-type common layer can be metallised during step g to provide the common contact.

In a variant to step a), rather than introducing extrinsic impurities, vacancies may be introduced to create the p-type layer by a post-growth anneal.

Rather than forming first and second windows by masking at step c, one or both may be formed by wet and/or dry etching the passivation layer.

Although the above examples are described using ion beam milling to type convert the second p-type layer to the n-type region, conversion may instead be achieved using impurity in-diffusion, e.g. of Hg, and anodic oxidation.

The photodiode element and detector array comprised therefrom may be configured to be operative at wavebands other than MWIR and LWIR. More broadly the photodiode element structure could be applied to detectors comprised from materials other than MCT in order to provide sensitivities to wavebands other than IR.

The invention claimed is:

1. A photodiode element that is responsive to dual band radiation, the photodiode element comprising:
a first p-type region;
a second p-type region;
a first n-type region arranged between the first p-type region and the second p-type region to provide PN-junctions;
one or more of the first p-type region, second p-type region and first n-type region being configured to provide a first absorbing region for absorbing a shorter wave band relative to a longer waveband, and a second absorbing region for absorbing the longer waveband, the first absorbing region and the second absorbing region being arranged on opposing sides of an n-type barrier provided by the n-type region, the n-type barrier being substantially non-absorbent to the longer wave band; the photodiode comprising:
a second n-type region that interfaces with the first n-type region; and
two ohmic electrical contacts, a first arranged on and contacting the second p-type region and a second arranged on and contacting the second n-type region.

2. A photodiode element according to claim 1, wherein the second n-type region interfaces with both the second p-type region and the first n-type region.

3. A photodiode element according to claim 1, wherein the first n-type region interfaces with at least a portion of the second p-type region that has been type converted.

4. A photodiode element according to claim 1, wherein the first p-type region provides, at least in part, the first absorbing region and the second p-type region provides, at least in part, the second absorbing region.

5. A photodiode element according to claim 1, wherein the second n-type region and the second p-type region interfaces with the n-type barrier.

6. A photodiode element according claim 5, wherein the first n-type region consists of the n-type barrier layer.

7. A photodiode element according to claim 1, wherein the first absorbing region and second absorbing region are provided, at least in part, by the first n-type region.

8. A photodiode element according to claim 7, wherein the first absorbing region is provided by the first p-type layer and the first n-type region, and the second absorbing region is provided by the second p-type region and the first n-type region.

9. A photodiode element according to claim 1, wherein one or more of the first p-type region; second p-type region first n-type region and second n-type region are formed from a mercury-cadmium-telluride semiconductor.

10. A photodiode element according to claim 1, being configured with a mesa photodiode element form.

11. A detector array comprising:
a combination of multiple photodiode elements, each configured according to claim 1.

* * * * *